United States Patent
Chang et al.

(10) Patent No.: US 6,785,175 B2
(45) Date of Patent: Aug. 31, 2004

(54) METHOD FOR REPAIRING MEMORY CELL

(75) Inventors: Chin-Min Chang, Keelung (TW);
Yu-Lin Shen, Tainan (TW);
Cheng-Cheng Wu, Taoyuan (TW)

(73) Assignee: Nanya Technology Corporation, Taoyuan (TW)

(*) Notice: Subject to any disclaimer, the term of this patent is extended or adjusted under 35 U.S.C. 154(b) by 0 days.

(21) Appl. No.: 10/457,507

(22) Filed: Jun. 9, 2003

(65) Prior Publication Data

US 2004/0001369 A1 Jan. 1, 2004

(30) Foreign Application Priority Data

Jun. 26, 2002 (TW) .......................................... 91114038 A

(51) Int. Cl.⁷ .............................................. G11C 29/00
(52) U.S. Cl. ...................................... 365/201; 714/718
(58) Field of Search ..................... 365/201, 63; 714/7, 714/718, 719

(56) References Cited

U.S. PATENT DOCUMENTS

| | | | | | |
|---|---|---|---|---|---|
| 6,085,334 | A | * | 7/2000 | Giles et al. | 714/7 |
| 6,119,251 | A | * | 9/2000 | Cloud et al. | 714/718 |
| 6,304,251 | B1 | * | 10/2001 | Ito et al. | 345/173 |
| 6,581,172 | B2 | * | 6/2003 | Totorica et al. | 714/718 |

* cited by examiner

*Primary Examiner*—Son T. Dinh
(74) *Attorney, Agent, or Firm*—Ladas & Parry

(57) ABSTRACT

A method for repairing a memory cell having a plurality of bit lines. The memory cell is tested with a compression testing mode, and future testing is set to compression testing mode when an error is detected, or to normal testing mode when no error is detected. It is determined whether detected errors warrant repair, and all repairs deemed necessary are performed.

11 Claims, 4 Drawing Sheets

METHOD FOR REPAIRING MEMORY CELL

BACKGROUND OF THE INVENTION

1. Field of the Invention

The invention relates to a repair method for a memory cell, and more particular to a method that repairs detected errors after testing.

2. Description of the Related Art

Integrated Circuit (IC) process consists of IC design, wafer manufacturing, wafer testing, and wafer assembly. After design and manufacture, wafers need to be assembled for sale. Since waste of resources can occur when assembling a defective wafer, every chip on a wafer must be tested before being assembled.

FIG. 1 shows a conventional method of checking a wafer with a probe.

In FIG. 1, the test machine comprises a probe head 12, the probe head 12 comprises a body 122 and a testing plate 124. A probe 126 is electrically connected to the body 122 of the probe head 12 via the testing plate 124 to transmit signals when the probe 126 contacts the bonding pad 162 of the wafer 16, set on a loading stage 10, such that the plate 124 can be changed corresponding to different circuits of the wafer 16.

A microscope 14 is connected to the aperture 128 of the probe head 12 to ensure probe contact with the bonding pad 162 when the probe 126 of the plate 124 aligns with and connects to the bonding pad 162. The loading stage 10 can be adjusted until the probe 126 contacts the bonding pad 162 to test the wafer 16.

A conventional semiconductor memory contains not only regular memory unit arrays but also spare memory unit arrays. A spare memory unit array functions as a backup memory unit array by filling in for defective parts of the defective regular memory unit array. Semiconductor memory devices here comprise RAM, DRAM, or SDRAM, and the regular memory unit array comprises bit lines.

FIG. 2 shows a conventional method for substituting a spare memory unit array for a regular memory unit array.

An address of defective line in the regular memory unit array 211 can be set by cutting the fuse unit of the spare decoder 215.

When a defined address signal is provided to the spare decoder 215, the decoder 215 can cooperate with the spare switch 213, so that a specific spare unit line in the spare memory unit array 214 can replace any defective lines on the regular memory unit array 211.

Test machines can only utilize compression test or normal testing modes, namely non-compression modes, because of the redundancy algorithm.

Most leading semiconductor companies have developed test techniques using compression testing mode for wafer testing to reduce time and costs, but some defects cannot be detected using the compression testing mode, resulting in defective memory devices reaching the assembly stage.

Defects in all memory devices can be detected with a normal testing mode, but this represents increased test time and cost.

SUMMARY OF THE INVENTION

The present invention is directed to a method for repairing a memory cell.

Accordingly, the present invention provides one embodiment of the method for repairing a memory cell, wherein the memory cell has a plurality of bit lines. A memory cell is provided, and the memory cell is tested with a compression testing mode. Future testing is set to compression testing mode when an error is detected, or, when no error is detected, as normal testing mode, after which the thus-far error-free cell is tested again, this time with a normal testing mode. It is determined whether detected errors warrant repair, and all repairs deemed necessary are then performed.

Accordingly, the present invention also provides another method for repairing a memory cell. A memory cell is provided, wherein the memory cell has a plurality of regular bit lines. The regular bit lines are separated into groups of N strips. Each group of regular bit lines is tested with a compression testing mode. Future tests are set to compression testing mode when errors are detected, or, when no errors are detected, to a normal testing mode. Detected errors are recorded for future reference. Groups of regular bit lines on which no error has yet been detected are then tested again, this time with normal testing mode. Detected errors are recorded for future reference. It is determined whether detected errors warrant repair, and all repairs deemed necessary are performed.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
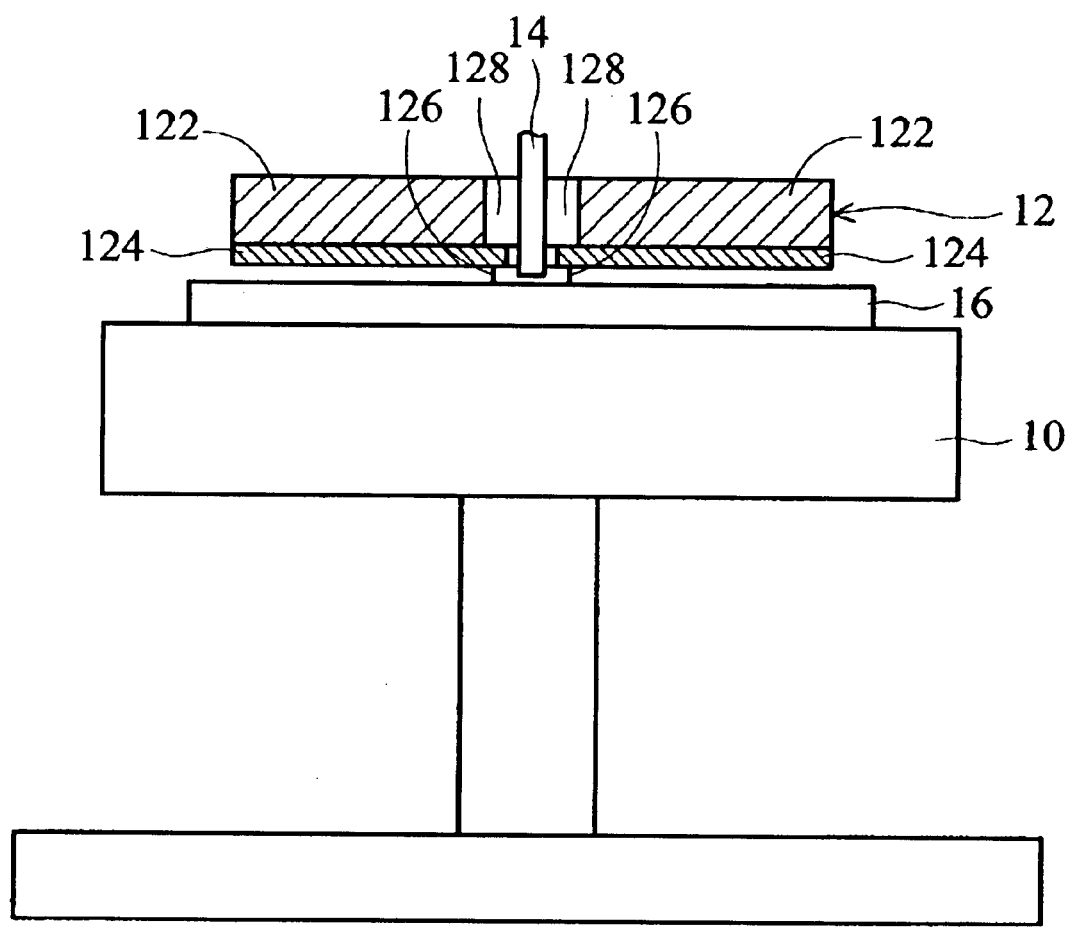
FIG. 1 shows a conventional method of checking of a wafer with a probe.
Figure 2:
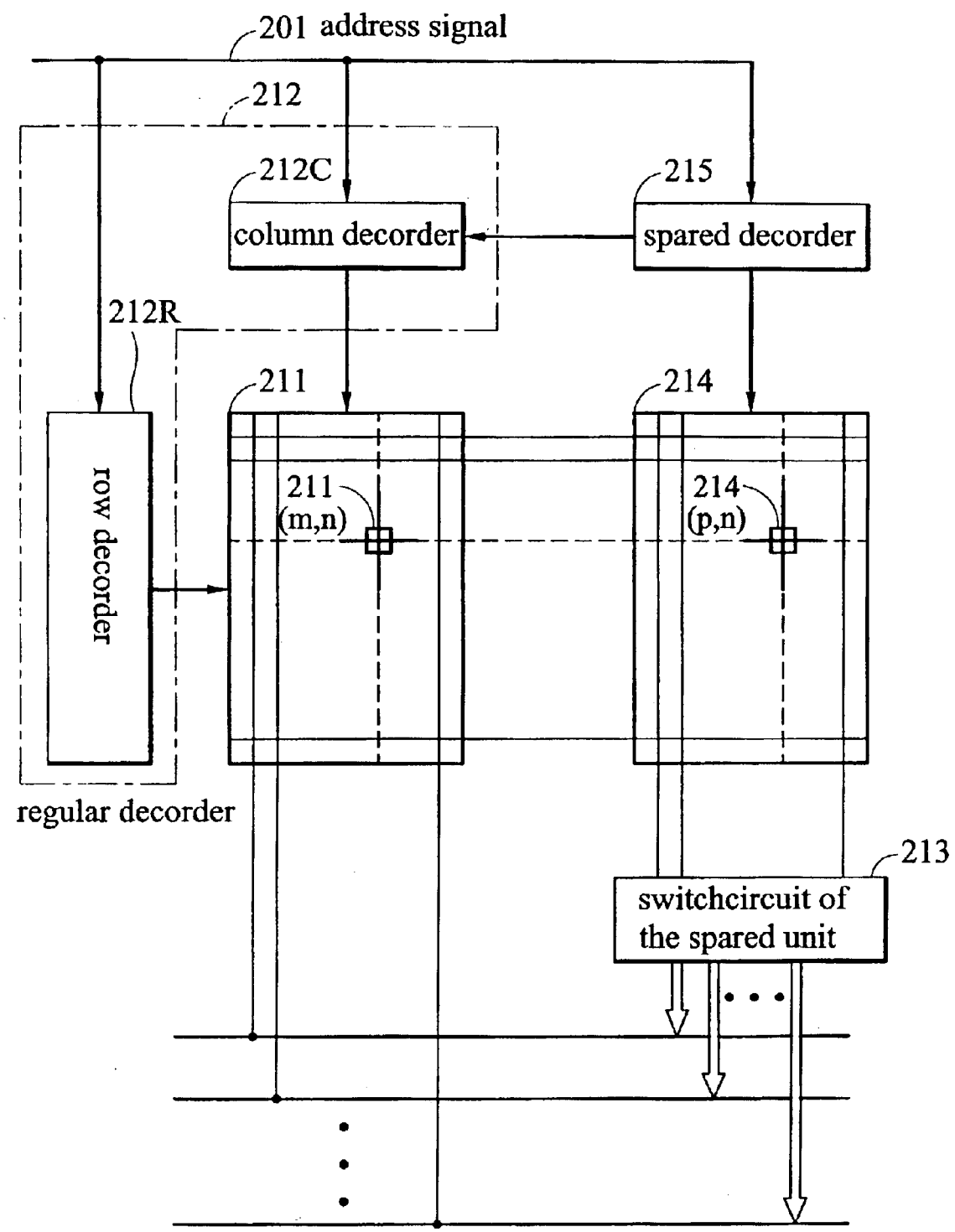
FIG. 2 shows a conventional method for substituting a spare memory unit array for a regular memory unit array.
Figure 3:
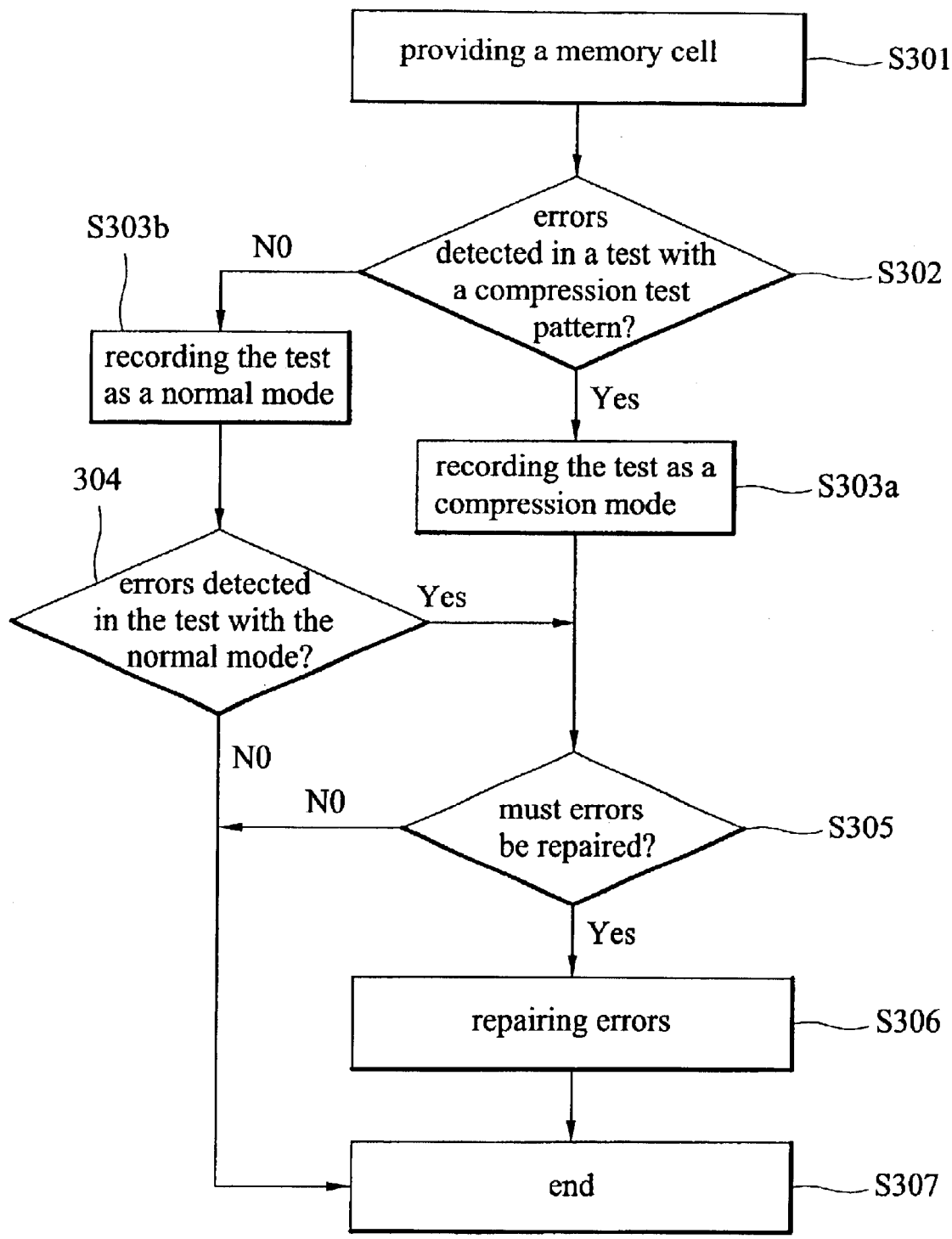
FIG. 3 is a flowchart of a method for repairing a memory cell of an embodiment of the present invention.

FIG. 3 is a flowchart of a method for repairing a memory cell of an embodiment of the present invention.

In step S301, a semiconductor memory unit, such as a memory cell, is placed in a predetermined position in a testing machine.

In step S302, the memory cell is tested with a compression testing mode, such as voltage test, voltage regulation test, current test, current regulation test, or frequency test. If errors are detected, the process continues to step S303a, and if errors are not detected, the process continues to step S303b.

In step S303a, future testing is set to compression mode, and the process continues to step S305.

In step S303b, future testing is set to normal mode, and the process continues to step S304.

In step S304, the memory cell is tested with the normal testing mode. If errors are detected, the process continues to step S305, and if errors are not detected, the process continues to step S307.

In step S305, it is determined whether detected errors warrant repair. If repairs are deemed necessary, the process continues to step S306, otherwise the process continues to step S307.

In step S306, errors are repaired.

In step S307, testing is concluded.

Figure 4:
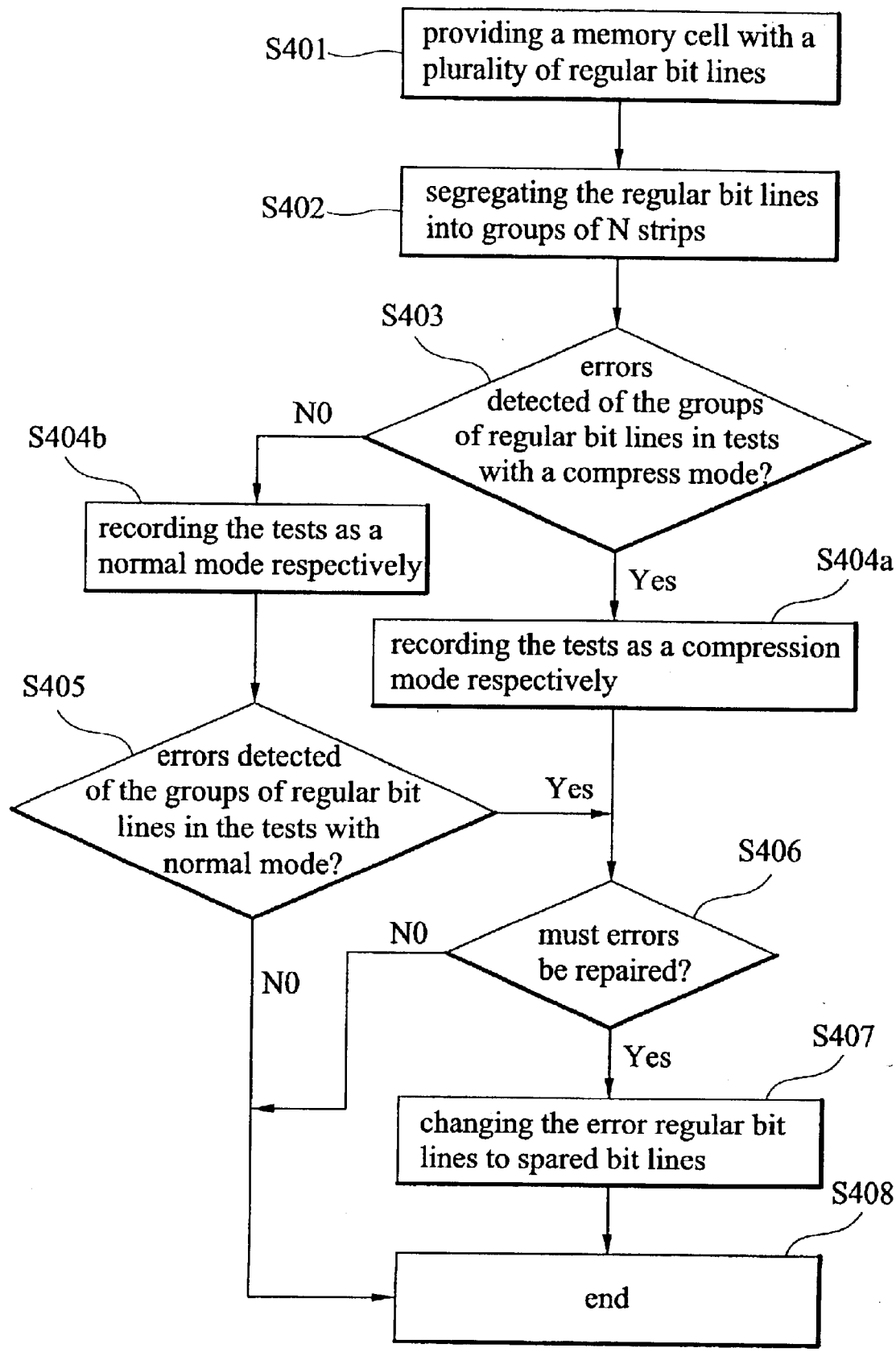
FIG. 4 is a flowchart of a method for repairing a memory cell of another embodiment of the present invention.

FIG. 4 is a flowchart of a method for repairing a memory cell according to another embodiment of the present invention.

In step S401, a semiconductor memory unit, such as a memory cell, is placed in a predetermined position in a testing machine. The memory cell has a plurality of regular bit lines and a plurality of spare bit lines. The regular bit lines are the necessary bit lines of the memory cell, for example, a 1024-bit memory cell has 1024 bit lines. The spare bit lines are backup bit lines to substitute for erroneous regular bit lines.

In step S402, the regular bit lines are separated into groups of N strips. N is greater than 1 and less than the total number of the regular bit lines, and the testing time is decreased when N is increased.

If N is 3, referred to as ⅓ time compression mode, one regular bit line remains after 341 testings of the groups of 3. The remaining regular bit line is created as another group for testing.

In step S403, each group is tested with a compression testing mode. If errors are detected, the process continues to step S404a, and if errors are not detected, the process continues to step S404b.

In step S404a, future tests are set to compression mode respectively, and the process continues to step S406.

In step S404b, future tests are set to normal mode respectively, and the process continues to step S405.

In step S405, each group is tested with a normal testing mode. If errors are detected, the process continues to step S406, and if errors are not detected, the process continues to step S408.

In step S406, it is determined whether detected errors in the regular bit lines warrant repair. If repairs are deemed necessary, the process continues to step S407, and if not, the process continues to step S408.

In step S407, the erroneous regular bit lines are changed to spare bit lines, and the process continues to step S408.

In step S408, the tests are ended.

For further illustration of the changing to spare lines, if the tenth regular bit line is erroneous and repair thereof is deemed necessary, one spare bit line is decoded to an address matching that of the tenth regular bit line, and the spare bit line is read, having been switched to connect from the tenth regular bit line.

Finally, testing time is reduced, since a predetermined test need only use at least a compression mode by the method of the present invention, and costs are thereby conserved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for repairing a memory cell, wherein the memory cell has a plurality of bit lines, comprising:

providing a memory cell;

testing the memory cell with a compression testing mode;

setting future testing of subsequent cells to compression testing mode when an error is detected or to normal testing mode when no error is detected;

testing the memory cell with a normal testing mode;

determining whether detected errors on the memory cell are warranted; and performing any repairs deemed necessary.

2. The method for repairing a memory cell in claim 1, wherein testing is concluded when no error is detected in the normal testing mode or no repairs are deemed necessary on the memory cell.

3. The method for repairing a memory cell in claim 1, wherein the compression testing mode further comprises the steps of:

dividing the bit lines of the memory cell into a plurality of blocks; and testing the blocks sequentially.

4. The method for repairing a memory cell in claim 1, wherein the normal testing mode further comprises testing each bit line individually.

5. The method for repairing a memory cell in claim 1, wherein erroneous regular bit lines are repaired by conversion to spare bit lines.

6. A method for repairing a memory cell, comprising:

providing a memory cell, wherein the memory cell has a plurality of regular bit lines;

separating the regular bit lines into groups of N strips;

testing each group of regular bit lines with a compression testing mode;

setting future tests of subsequent groups to compression testing mode when errors are detected or to normal testing mode when no errors are detected;

recording errors in the regular bit lines;

testing each group of regular bit lines with a normal testing mode;

recording any newly detected errors;

determining whether repair of detected errors is warranted; and performing any repairs deemed necessary.

7. The method for repairing a memory cell in claim 6, wherein the normal testing mode further comprises testing each regular bit line individually.

8. The method for repairing a memory cell in claim 6, wherein testing is concluded when no errors are detected in the regular bit line with normal testing mode or no repair of errors detected in the regular bit lines is deemed necessary.

9. The method for repairing a memory cell in claim 6, wherein erroneous regular bit lines are repaired by conversion to spare bit lines.

10. The method for repairing a memory cell in claim 6, wherein any regular bit lines remaining in groups of less than N after separation are defined as one group.

11. The method for repairing a memory cell in claim 6, wherein N is greater than 1 and less than the total number of regular bit lines.

* * * * *